US007985920B2

(12) United States Patent
Cohen

(10) Patent No.: US 7,985,920 B2
(45) Date of Patent: Jul. 26, 2011

(54) SOLAR CONCENTRATOR WITH SELF-TRACKING RECEIVER

(76) Inventor: Eli Cohen, Lincoln Park, NJ (US)

( * ) Notice: Subject to any disclaimer, the term of this patent is extended or adjusted under 35 U.S.C. 154(b) by 0 days.

(21) Appl. No.: 12/690,684

(22) Filed: Jan. 20, 2010

(65) Prior Publication Data
US 2010/0236602 A1    Sep. 23, 2010

Related U.S. Application Data

(60) Provisional application No. 61/210,803, filed on Mar. 23, 2009.

(51) Int. Cl.
*H01L 31/042* (2006.01)
*H02N 6/00* (2006.01)

(52) U.S. Cl. ........ 136/246; 136/244; 52/173.3; 126/621

(58) Field of Classification Search .................. 136/244, 136/246; 52/173.3; 126/621
See application file for complete search history.

(56) References Cited

U.S. PATENT DOCUMENTS

| 4,031,385 | A | 6/1977 | Zerlaut et al. |
| 4,068,653 | A | 1/1978 | Bourdon et al. |
| 4,098,264 | A | 7/1978 | Brokaw |
| 4,153,039 | A | 5/1979 | Carroll |
| 4,349,733 | A | 9/1982 | Beam |
| 4,469,938 | A | 9/1984 | Cohen |

*Primary Examiner* — Basia Ridley
*Assistant Examiner* — Tamir Ayad
(74) *Attorney, Agent, or Firm* — Antonio Papageorgiou Ostrow Kaufman LLP

(57) ABSTRACT

Solar collection systems are provided herein that includes a mobile, self-tracking receiver support member which is suspended from a support beam spanning the two sides of an immobile solar trough concentrator. The self-tracking receiver support member has photovoltaic cells of equal power affixed to two or more downward facing surfaces of the support member. These photovoltaic cells face downward into the solar parabolic trough concentrator and respond to the concentrated light of the path of the points of focus being reflected upwards from a parabolic concentrator. The solar cells are wired to a DC electric motor so that the motor rotationally responds to the disparity in the power output of the solar cells. As the path of the points of focus of the solar concentrator moves to one side or the other of the center of the self-tracking support member, the motor automatically moves the support member, along with and the receiver it is carrying, into the parabolic concentrator's path of the points of focus. This self-tracking member combines the functions of tracking the sun while also transporting the receiver attached thereto into the concentrator's path of the points of focus. The power to drive the motor is preferably provided solely by the power of the sun.

17 Claims, 13 Drawing Sheets

SOLAR CONCENTRATOR WITH SELF-TRACKING RECEIVER

RELATED APPLICATION

This application claims the benefit of U.S. Provisional Application No. 61/210,803, filed Mar. 23, 2009, which is hereby incorporated herein by reference.

BACKGROUND OF THE INVENTION

The present invention is directed to the field of solar collectors and more specifically solar collectors with parabolic trough and other types of concentrators.

Solar energy has taken a prominent position in addressing the increasing need for non-polluting alternative sources of energy. Currently, there are four principal means for tapping solar energy. They are (1) parabolic trough concentrators, (2) heliostats (3) photoelectric cell modules, and (4) flat plated hot water collectors. Among these, large arrays of parabolic trough concentrators have become increasingly popular. These arrays, which cover many acres, are typically used to create steam that is then used to generate electricity. The electricity is then pumped into the power grid for distribution elsewhere. This process, however, has several limitations, including significant losses of energy in the conversion of solar energy into electricity and losses in transmitting electricity from the solar arrays to the points of usage.

Applicant proposes herein a simple and practical means for harvesting solar power directly at the point of usage, which include buildings and other structures constructed with parabolic roofs and/or canopies with integral parabolic trough or other solar concentrators that provide on-site solar energy for heat, hot water, and air conditioning, in addition to electricity. Because these structures are essentially immobile, and the path of the points of focus of a solar parabolic trough concentrator move with diurnal and seasonal changes, these solar concentrators or preferably the receivers associated therewith should include self-tracking systems that maintain the receiver in the concentrator's path of the points of focus.

A number of patents have been issued that are directed to solar tracking systems and specifically ones that incorporate photovoltaic cells therein. These include: U.S. Pat. No. 4,031,385 issued to Zerlaut et al., U.S. Pat. No. 4,098,264 issued to Brokaw, U.S. Pat. No. 4,068,653 issued to Bourdon et al., U.S. Pat. No. 4,153,039 issued to Carroll, and U.S. Pat. No. 4,349,733 issued to Beam, which are hereby incorporated herein by reference. The photovoltaic cells in these patents, however, face directly towards the sun. As a result, these cells generate insufficient energy to independently operate the tracking motor of these systems and these systems therefore limit use of the electricity generated with these cells for signal purposes only. As a further result, these systems are not usable at locations where there is no external source of electricity.

Moreover, although U.S. Pat. No. 4,469,938 issued to Cohen, which is also hereby incorporated herein by reference, focuses the photovoltaic cells downward into the parabolic trough concentrator, the '938 patent is designed primarily to move a lightweight aluminized Mylar film concentrator. Although the '938 patent's system is scalable to some extent, the ability of the ability of the tracking solar cells to move the entire reflector places a practical limit on the size of the concentrator. This patent seeks to overcome that limitation by using the tracking solar cells to move the collector pipe instead of the reflector.

Accordingly, there is a need for self-tracking parabolic trough and other solar concentrator systems that are not reliant on external sources of energy to power their tracking motors. There is also generally a need for self-tracking solar concentrator systems that are simple and therefore less expensive to produce, even in large scale systems.

SUMMARY OF THE INVENTION

In one embodiment, a solar collector is provided that includes a parabolic solar concentrator having a parabolic cross section with a first end, a second end, a midpoint between the first end and the second end, and a path of the points of focus; a support beam having a length that spans across the first and the second ends of the concentrator; and a receiver support member movably attached to the support beam above the concentrator. The receiver support member includes a receiver at least loosely attached to the receiver support member, a plurality of photovoltaic cells, at least one of the cells facing a first direction and at least one other of the cells facing a second facing a direction toward the concentrator different than the first direction, and a motor that is operatively coupled to the receiver support member for the motor to move the support member along at least a portion of the length of the support beam. In this instance, the photovoltaic cells are electrically coupled to the motor to provide a signal to control the movement of the motor and to provide at least a portion of the power to drive the motor.

In one embodiment, the receiver support member includes a hook shaped portion having a first leg and a second leg that meet at a vertex facing toward the concentrator. The at least one of the photovoltaic cells is disposed on the first leg, at least another one of the photovoltaic cells is disposed on the second leg, and the receiver is disposed in a notch of the hook shaped portion. The hook shaped portion of the support member and the receiver may share a common center point and the motor may move the hook shaped portion along the path of the points of focus of the concentrator.

The hook shaped portion may include an upright portion that has an end that extends from one of the legs and an opposite end that movably couples the hook shaped portion to the support beam. In one embodiment, the hook shaped portion comprises a trolley disposed on the opposite end of the upright portion and within the support beam through a lengthwise opening in the support beam that allows the trolley to move along at least a portion of the length of the support beam. The trolley may be coupled to the motor with at least one of a guide wire or cable, the motor therewith operable to pull the trolley in at least one direction along the length of the support beam. The trolley may include a plurality of wheels that ride on at least one flange associated with the support beam. In one embodiment, the collector includes a plurality of pulleys at opposite ends of the hook portion in line with the support beam and a continuous wire or cable loop attached to the opposite ends of the trolley, wherein the motor drives one of the plurality of pulleys.

In one embodiment, the motor is integrated into the hook shaped portion at the opposite end of the upright portion, the motor including at least one toothed gear that acts against corresponding teeth disposed on a flange associated with the support beam. The support beam may be a tubular member where the motor is at least partially disposed within the tubular member through a lengthwise opening in the support beam. The flange may include a toothed belt bonded to the flange.

In one embodiment, the motor is integrated into the hook shaped portion at the opposite end of the upright portion, the motor comprising a threaded rod that acts against a corresponding nut fixed to the support beam. The hook portion may be movably attached to the support beam with a collar and the motor and nut may be disposed exterior to the support beam.

In one embodiment, a solar collector is provided that includes a parabolic trough solar concentrator having a parabolic cross section with a first end, a second end, a midpoint between the first end and the second end, and a path of the points of focus; a support beam having a length that spans across the first and the second ends of the concentrator and that has a shape that matches the path of the points of focus of the concentrator; and a receiver support member movably attached to the support beam above the concentrator. The receiver support member includes a hook shaped portion having a first leg and a second leg that meet at a vertex facing toward the concentrator, a receiver at least loosely attached to the receiver support member in a notch of the hook shaped portion, a plurality of photovoltaic cells, at least one of the cells disposed on the first leg facing a first direction and at least one other of the cells disposed on the second leg facing a second direction toward the concentrator different than the first direction, and a motor that is operatively coupled to the receiver support member for the motor to move the support member along at least a portion of the length of the support beam along a path of the points of focus of the concentrator. The photovoltaic cells are electrically coupled to the motor to provide a signal to control the motor and to provide at least a portion of the power to drive the motor.

In one embodiment, a solar tracking system is provided that includes an immobile solar parabolic trough concentrator, the concentrator directing all of the sunlight reflected off of its surface to a single path of the points of focus; a support beam or beams, having a curvature, that spans the solar parabolic concentrator, the curvature of the support beam duplicating the path of the points of focus of the solar parabolic trough concentrator; a "V" or modified "V" shaped self-tracking receiver support member suspended from the support beam, the self-tracking support member having two or more surfaces facing downward into the solar parabolic trough concentrator; two or more equally powered, photovoltaic cells oppositionally attached to the downward facing surfaces of the self-tracking hook, the downward facing photovoltaic cells intercepting the solar lines reflected off the solar parabolic trough concentrator; and a receiver placed into the "V" or modified "V" section of the self-tracking support member, the receiver being in alignment with the center point between the opposing photovoltaic cells. The motor, responding to the differential current from the opposing photovoltaic cells, moves the self-tracking hook and the receiver as a unit into the path of the points of focus of the solar parabolic trough concentrator and the motor, responding to the differential current from the opposing photovoltaic cells, moves the self-tracking hook and the receiver into the focal point of the solar parabolic trough concentrator.

Additional aspects of the present invention will be apparent in view of the description which follows.

DETAILED DESCRIPTION OF THE INVENTION

A solar energy collector system or systems are provided herewith that generally include a solar concentrator and a receiver movably associated therewith. In at least one embodiment, the receiver is attached to a self-tracking receiver support member that is movably attached to a support beam. The support bean holds and transports the support member/receiver of the solar system, keeping the receiver centered on or as near as possible to the concentrator's path of the points of focus of the reflected rays. This system preferably includes at least one photovoltaic cell that provides the power for one or more motors that move the receiver support member relative to the concentrator. In this respect, the system maintains the support member/receiver in the desired alignment with the concentrator without the need for an outside source of power. Because this system requires no outside source of power, it has exceptional utility in areas prone to power blackouts and it is also ideal for remote environments that are not connected to an electric grid.

Figure 1:
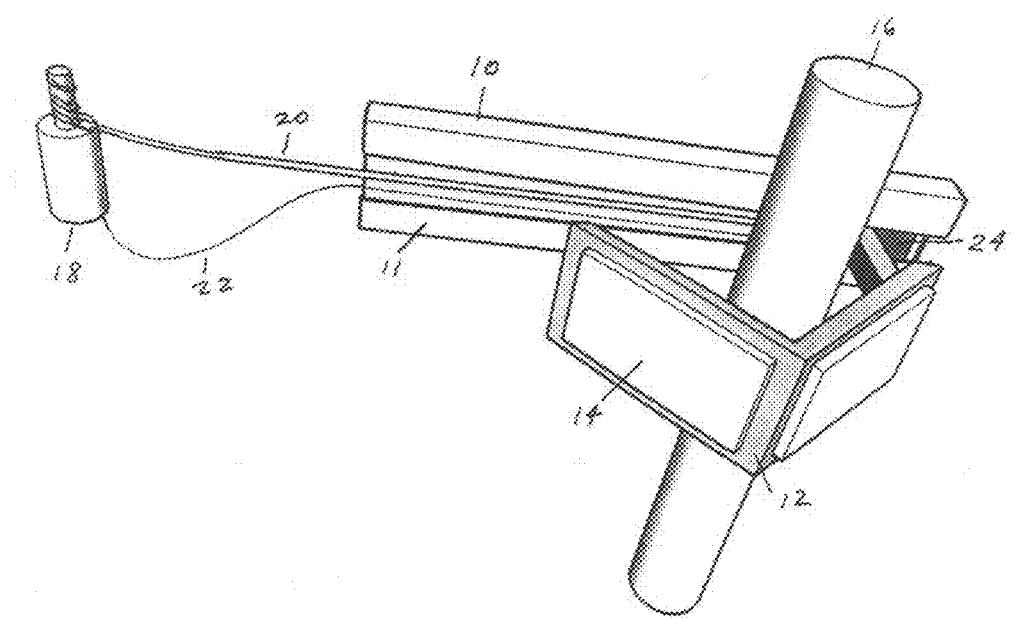
FIG. 1 is a perspective upward view of a self-tracking solar receiver according to at least one embodiment of the systems disclosed herein, which includes a support hook movably mounted to a support beam.
Figure 9:
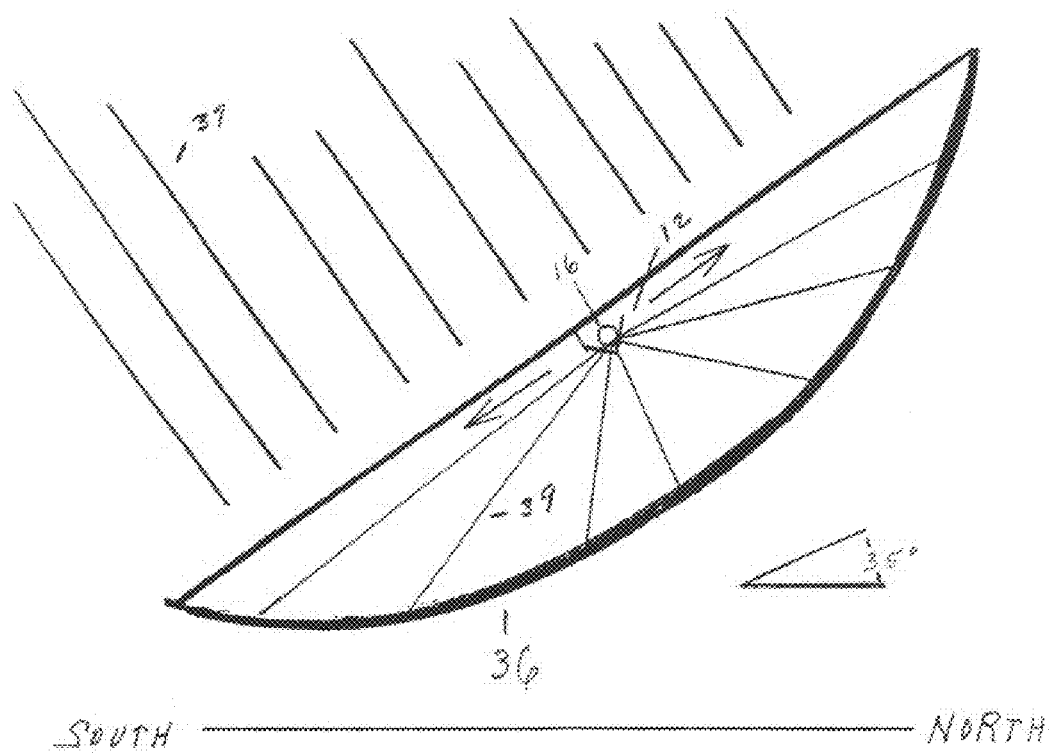
FIG. 9 is a lateral view of the solar parabolic trough concentrator according to at least one embodiment of the systems disclosed herein showing the sun's rays reflecting off the concentrator towards the self-tracking support hook.

Referring to FIG. 1, in at least one embodiment, the system includes a self-tracking receiver support member 12 that includes a "V" shaped portion, hereinafter referred to a support hook or simply a hook. Although the support member 12 is referred to and shown in the figures as a hook 12, it is understood that the support member 12 may take any shape or form and is thus not limited thereto. In this instance, the hook 12 includes a plurality of photovoltaic cells 14 facing downward toward the concentrator that capture the concentrated solar rays 39 being reflected from the solar parabolic trough concentrator 36 as shown in FIG. 9. Preferably, the self-tracking hook 12 holds the receiver 16 in the notch of the "V" shaped portion.

As shown in FIG. 9, the self-tracking hook 12 is suspended at one end above the concentrator 36 with the support beam 10. In this instance, the hook 12 includes an upright portion that has an end that extends from one of the sides of the "V" shape toward the support beam 10. The opposite end of the upright portion is movably coupled to the support beam 10, in this embodiment, with a trolley 24. That is, the opposite end of the upright portion connects to a block or trolley 24 disposed within the support beam 10 through a lengthwise opening in support beam 10 such that the trolley 24 can move along at least a portion of the length of the support beam 10. The trolley 24 is connected to at least one guide wire or cable 20 that is further operatively coupled to a motor 18. In this arrangement, the trolley 24 is pulled by the motor 18 by drawing the wire or cable 20. The trolley 24 may be moved in the opposite direction by gravity or by the motor 18. The motor 18 is powered by the photovoltaic cells 14 with electric connections 22. In some or all embodiments disclosed herein a high torque, low RPM DC electric motor is used to move the receiver 16 since the actual distance that the receiver 16 will move in a typical day will be relatively very small. This permits the use of a small electric motor 18 that can fit into the spaces and the geometry proposed herein.

Figure 1A:
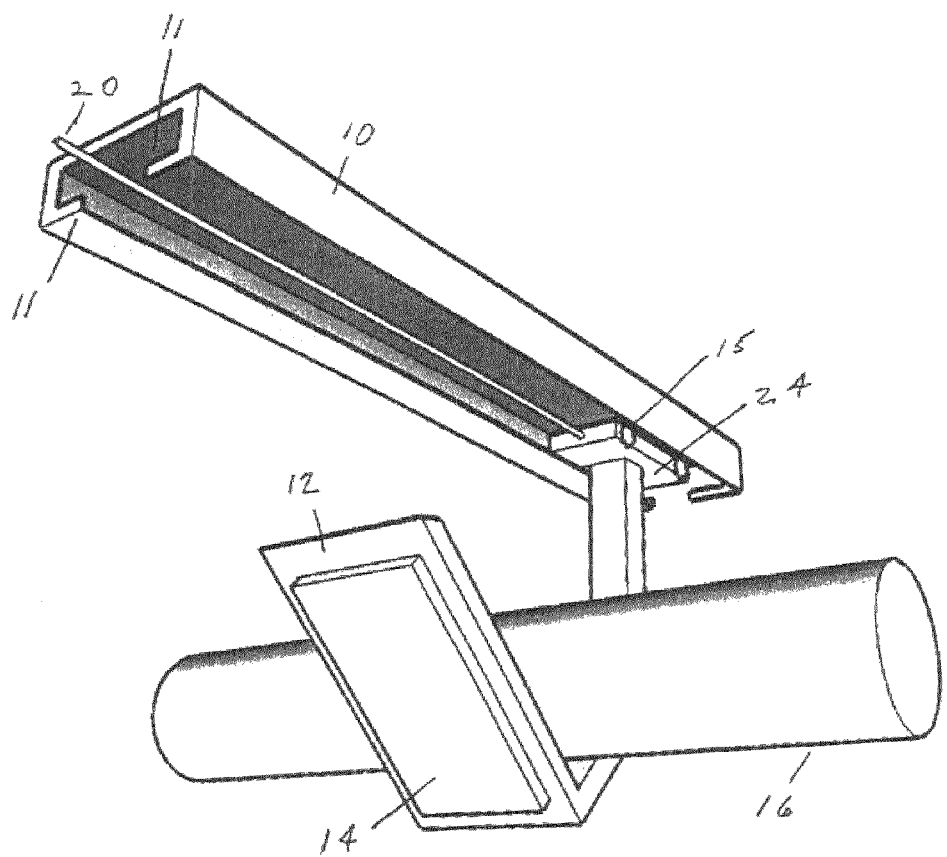
FIG. 1A is a cut-away view of a self-tracking solar receiver according to at least one embodiment of the systems disclosed herein, which includes a support hook movably mounted to a support been using a trolley system that rides on a flange of the support beam.

FIG. 1A is a perspective view of the self-tracking hook 12 shown in FIG. 1 with a flange 11 of the support beam 10 cut away to display the trolley 24, in this instance with wheels 15. In this embodiment, the support beam 10 is a tubular member having a generally rectangular cross section. The support beam 10 further includes a lengthwise opening, which the hook 12 passes through, with flanges 11 on either end of the opening to support the trolley 24. The wheels ride on the flanges 11 of the support beam 10 as the wire or cable 20 is pulled or released.

Figure 1B:
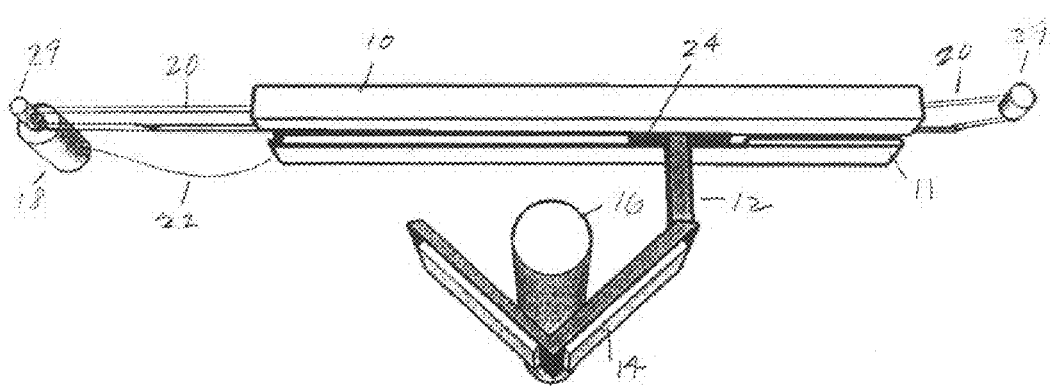
FIG. 1B is a lateral cut-away view of a self-tracking solar receiver according to at least one embodiment of the systems disclosed herein, which includes a support hook that uses a wire or cable disposed around two pulleys located on opposite ends of the support hook in line with the support beam.

FIG. 1B is a perspective view of one embodiment of the self-tracking hook 12 particularly applicable to lower latitudes, where the tilt of the solar parabolic trough concentrator 36 may be insufficient for the trolley 24 to roll downwards by gravity alone. In this instance, a clothes-line type pulley system 29 may be used, which includes a pulley at opposite ends of the hook 12 in line with the support beam 10. Instead of the single wire or cable 20 attached to the trolley 24 shown in FIG. 1A, in this embodiment a continuous wire or cable 20 loop is be attached to both of the opposite ends of the trolley 24 and also around each of the pulleys 29, with the electric motor driving one of the pulleys 29. Because of the minimal actual movement of the cable 20, this system is practical even for curved support beams. A tubular support beam is used for illustration purposes only. It is understood that this double-pulley, clothes-line system can be used for any support beam geometry and at all latitudes.

Figure 2:
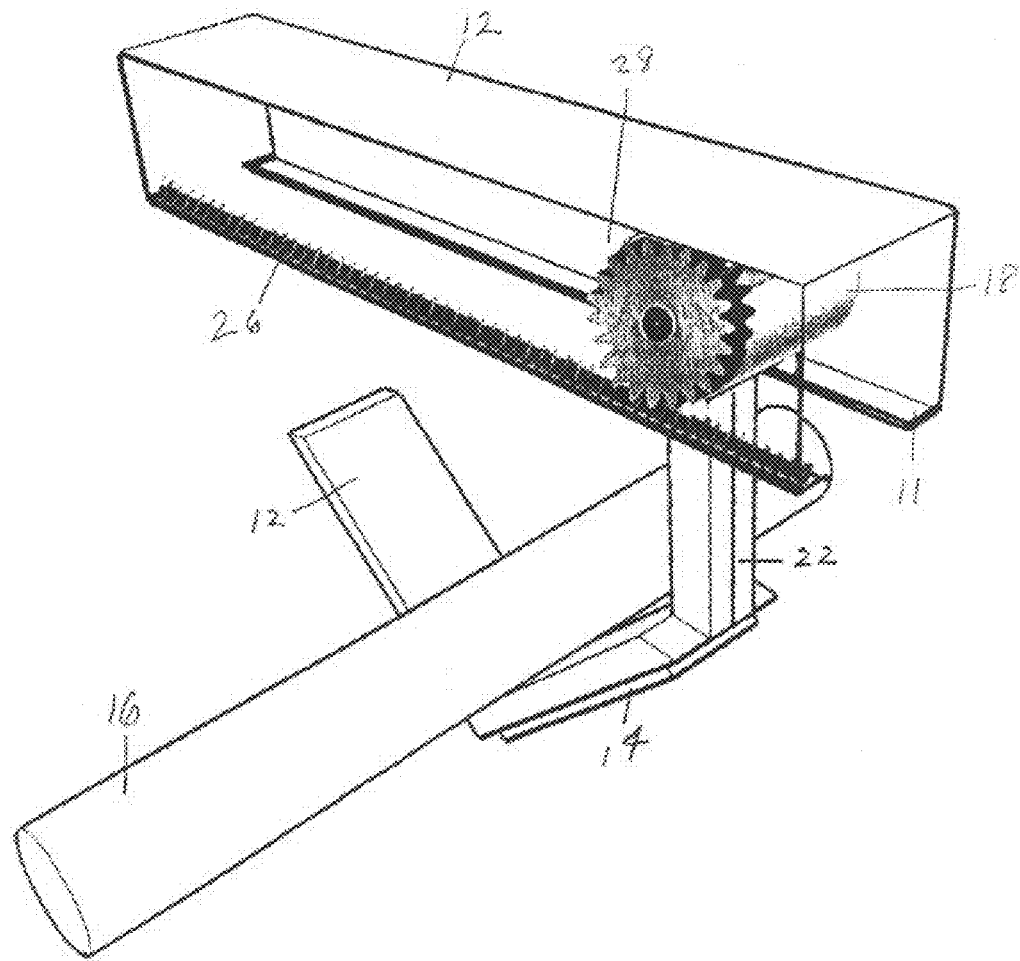
FIG. 2 is a lateral cut-away view of a self-tracking solar receiver according to at least one embodiment of the systems disclosed herein, which includes a support hook with a motor integrated therein that turns a gear that acts against corresponding teeth attached to a flange of the support beam.

FIG. 2 is a lateral cutaway view of a of a support beam 10 of self-tracking hook 12, according to at least one embodiment of the systems disclosed herein, showing an integrated electric motor 18 with a toothed gear 28 that engages or otherwise acts against corresponding teeth 26 disposed on a flange 11 of the support beam 10. That is, the electric motor 18 is integrated into the support hook 12, e.g., at the end within the support beam 10. The gear on the motor 18 may act directly against the teeth 26 on the flange 11 or with intermediate gears (not shown). In the later embodiment, a smaller gear may be driven by the motor 18 and the smaller gear may act against a larger gear that then acts against the teeth 26 on the flange 11. In this instance, the gears multiply the force produced by the motor 18 bases on the ratio of the large gear to the small gear diameters. The teeth 26 may be formed directly on the flange or on a belt that is attached or bonded to that flange 11. In either event, the teeth 26 extend along at least a portion of the length of at least one of the flanges 11 of the support beam 10. The weight of the hook 12 may bear directly against the teeth 26 or the weight may bear against a separate bearing surface or surfaces, on the flange 11 or elsewhere in the beam 10. The motor 18 may also be disposed on a trolley, with or without wheels, that provides the weight bearing function for the hook 12.

As with other embodiments, the electrical connectors 22 are disposed only on the moving parts of the system, enclosed within the self-tracking hook 12 or otherwise. Enclosing the connectors 22 within the hook 12 protects them from the elements and the extreme heat generated by the solar parabolic trough concentrators 36. Although the connections 22 are displayed in FIG. 2 on the side of the self-tracking hook 12, the electrical connectors may be encased within the self-tracking hook 12. By running these electrical connectors 22 directly to the electric motor 18, the connectors 22 in operation are not subject to the mechanical stress that may be exerted thereon when connecting moving and non-moving parts.

Figure 3:
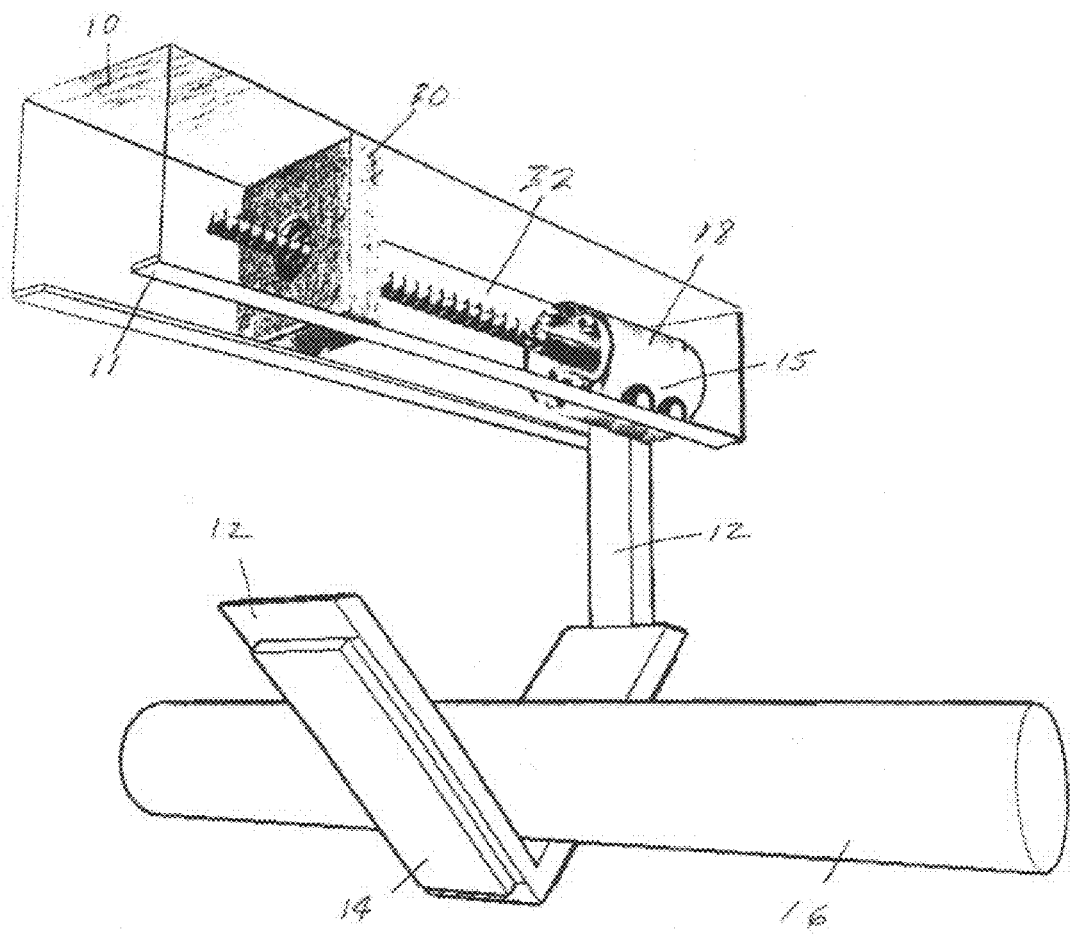
FIG. 3 is a lateral cut-away view of a self-tracking solar receiver according to at least one embodiment of the systems disclosed herein, which includes a support hook with a motor integrated therein that turns a threaded rod that acts against a corresponding threaded nut attached to the support beam.

FIG. 3 is a lateral cutaway view of a self-tracking solar receiver according to at least one embodiment of the systems disclosed herein, which includes a motor 18 integrated into the support hook 12. In this instance, the motor 18 turns a threaded rod 32 that acts against a corresponding nut 30. The motor 18 is enclosed within the support beam 10 and is allowed to move along at least a portion of the length of the support beam 10, whereas the bolt 30 is fixed to the channel wall of the support beam 10. The motor 18 may ride on wheels 15 that allow the motor 18 to roll on the flanges 11 of the support beam 10. This particular embodiment is more appropriate for a parabola for which the chord is a straight line.

Figure 4:
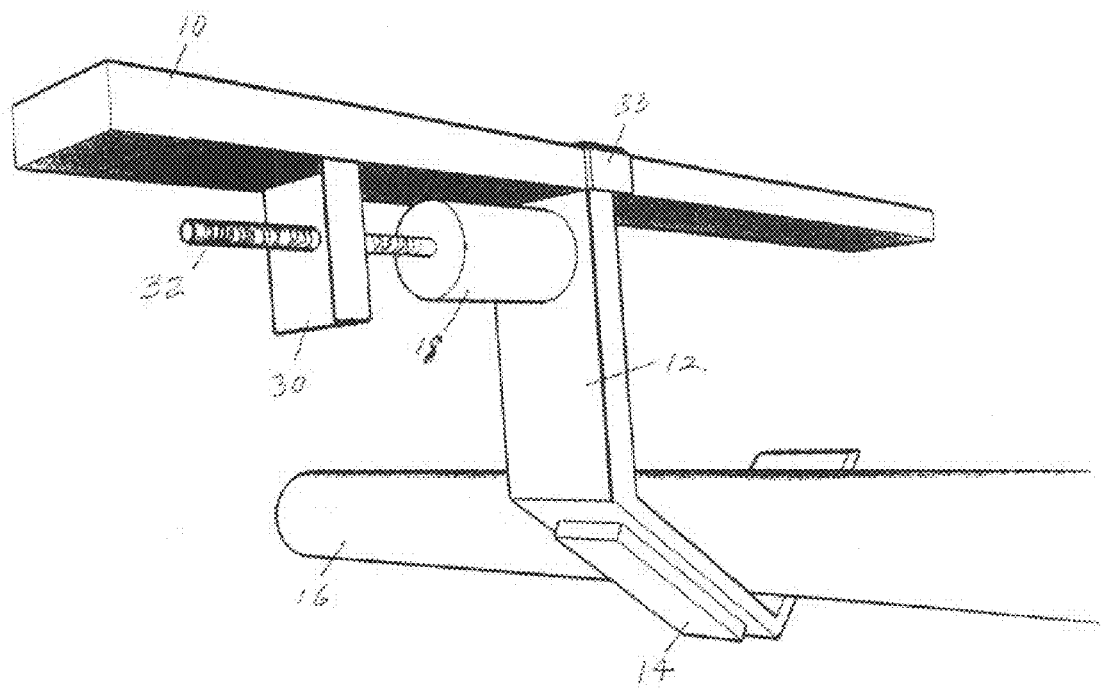
FIG. 4 is a lateral view of a self-tracking solar receiver according to at least one embodiment of the systems disclosed herein, which includes a support hook with a motor integrated therein that turns a threaded rod that acts against a corresponding threaded nut attached to the support beam beneath the support.

FIG. 4 is a lateral view of a self-tracking solar receiver according to at least one embodiment, with an integrated motorized nut and bolt drive. That is, the motor 18 is attached to the self-tracking hook 12 similar to the embodiment shown in FIG. 3, except that the motor 18, rod 32, and nut 30 are located exterior to the support beam 10. The support beam 10 is not channeled as in the other embodiments, but is solid or hollow without the length wise opening for the hook 12 to pass through. In this instance, the self-tracking hook 12 is loosely attached to the support beam 10 by a collar 33. That is, the collar 33 bears the weigh of the hook 12 onto the beam 10 while allowing the hook 12 to move along at least a portion of the length of the support beam 10. This particular embodiment is also more appropriate for a parabola for which the chord is a straight line.

In the embodiments shown in FIGS. 3 and 4, the motor 18 generally turns the rod 32, which acts against the fixed nut 30 to move the hook 12 in the desired direction. The photovoltaic cells 14 provide the power and the signal to command the high torque, low RPM DC motor 18 to move the self-tracking hook 12 and the receiver 16 attached thereto along the path of the points of focus of the reflected rays of the concentrator. Although these embodiments are shown with the motor 18 attached to the self-tracking hook 12 and the nut 30 fixed to the beam 10, these components may be used in reverse.

Figure 5:
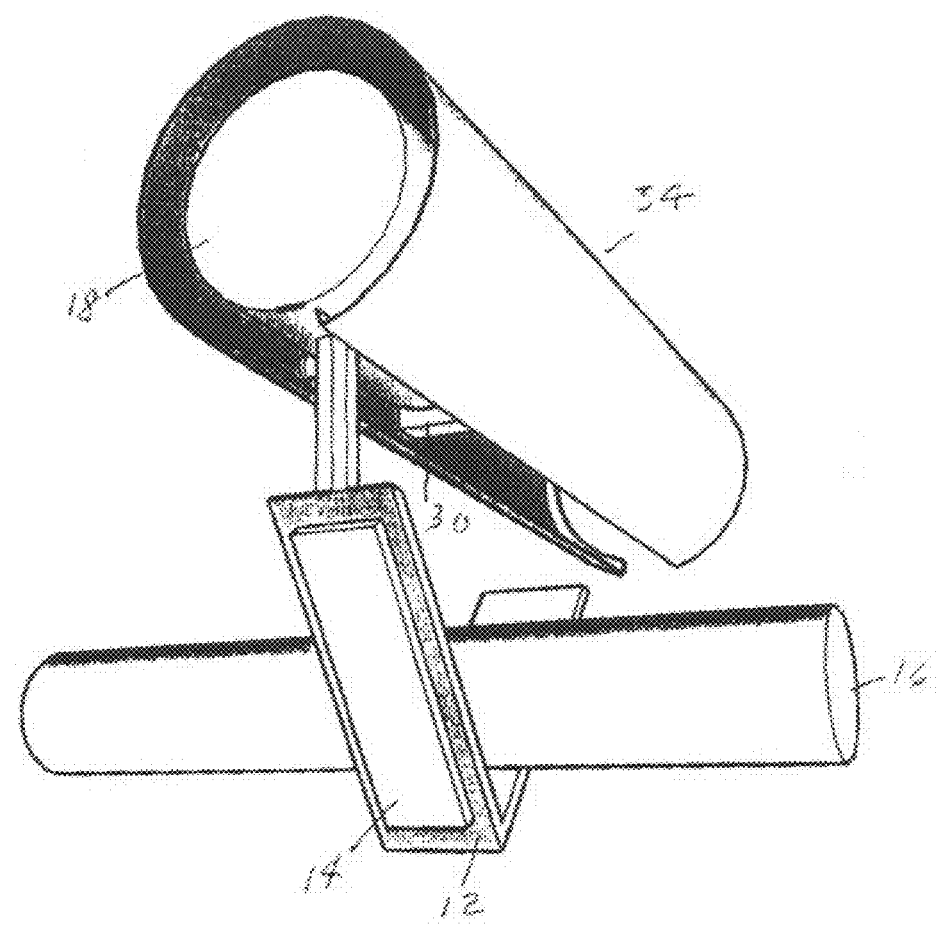
FIG. 5 is a lateral view of a self-tracking solar receiver according to at least one embodiment of the systems disclosed herein, which includes a support hook with a motorized nut and bolt drive system disposed within a cylindrical tubular support beam.

FIG. 5 is a lateral view of a self-tracking solar receiver according to at least one embodiment of the systems disclosed herein, which includes a support hook 12 with a motorized nut and bolt 30 drive incorporated within a cylindrical tubular support beam 34. The use of a tubular support beam may have advantages over other geometric shapes. For example, the circular cross section would reduce accumulation of dust or ice on its rounded surface, and it may be more economical to use.

Figure 6:
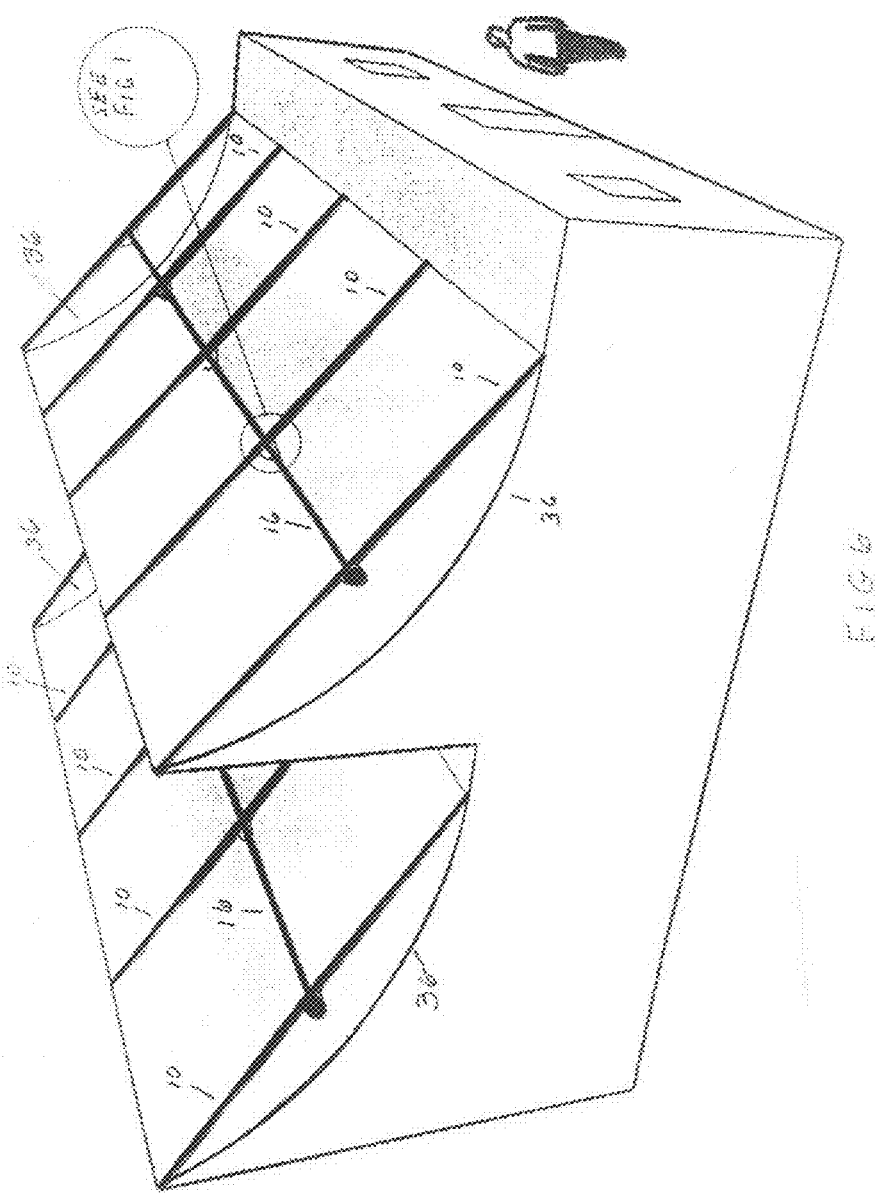
FIG. 6 is a perspective view of a structure according to at least one embodiment of the systems disclosed herein, which includes a modified saw-toothed roof incorporating two solar parabolic trough concentrators.

FIG. 6 is a perspective of a structure according to at least one embodiment of the systems disclosed herein, which includes a modified saw-toothed roof incorporating two rows of solar parabolic trough concentrators. The curvature of these concentrators preferably conforms to the equation $Y^2=4AX$. This curvature insures that the path of the points of focus of the concentrator is essentially a straight line between the two ends of the parabolic cross section of the concentrator, which permits the support beam 10 that the hook 12 moves along to be structurally straight. Care must be taken for the support beam 10 to be constructed several inches above the actual center point of the receiver 16 so that the receiver 16 and not the support beam 10 is in the path of the points of focus. Due to the shadow effect caused by the extreme angles of the sun at sunrise and sunset, it may be desirable to replace self-tracking hooks 12 on support beams 10 at the ends of the trough concentrator with non-tracking hooks. In this way, there would be little if any resistance to the movement of the receiver 16 that may otherwise occur from electric motors 18 disposed on the end support beams.

The structure generally includes at least one at least one parabolic trough concentrator 36. The concentrators 36 have a parabolic cross section, as the name implies, with a receiver 16 that is normal to the parabolic cross section, as shown in FIG. 9. The receiver 16 is generally suspended over the concentrator 36 with a plurality of support beams 10, each of the support beams 10 having a self-tracking support member 12 movably attaching the receiver 16 to the support beams 10. The support beams 10 are essentially parallel to the path of the points of focus of the concentrator 36 and are fixed on either end of the parabolic cross section of the concentrator 36.

Figure 7:
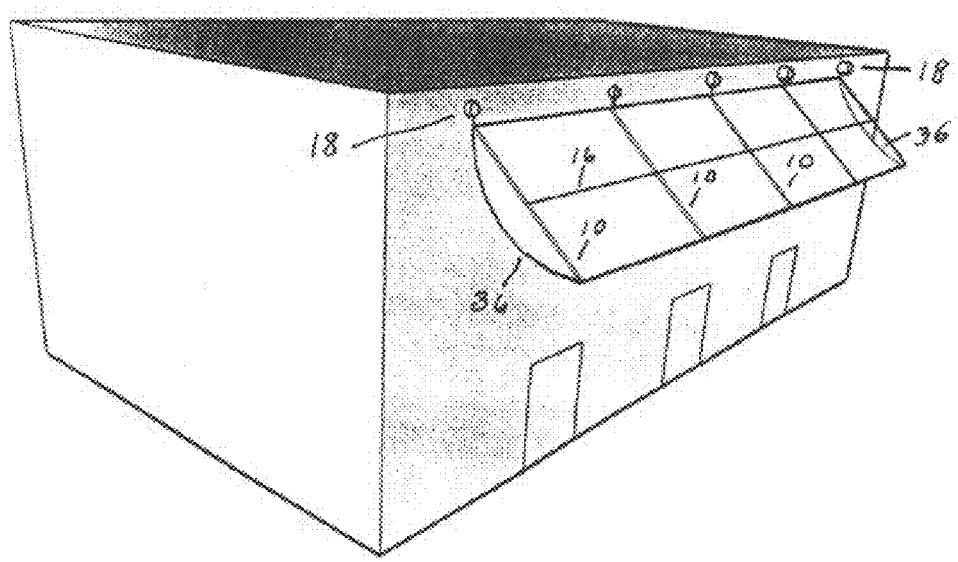
FIG. 7 is a perspective view of a structure according to at least one embodiment of the systems disclosed herein, which includes a parabolic solar canopy with electric motors attached to the structure.
Figure 10:
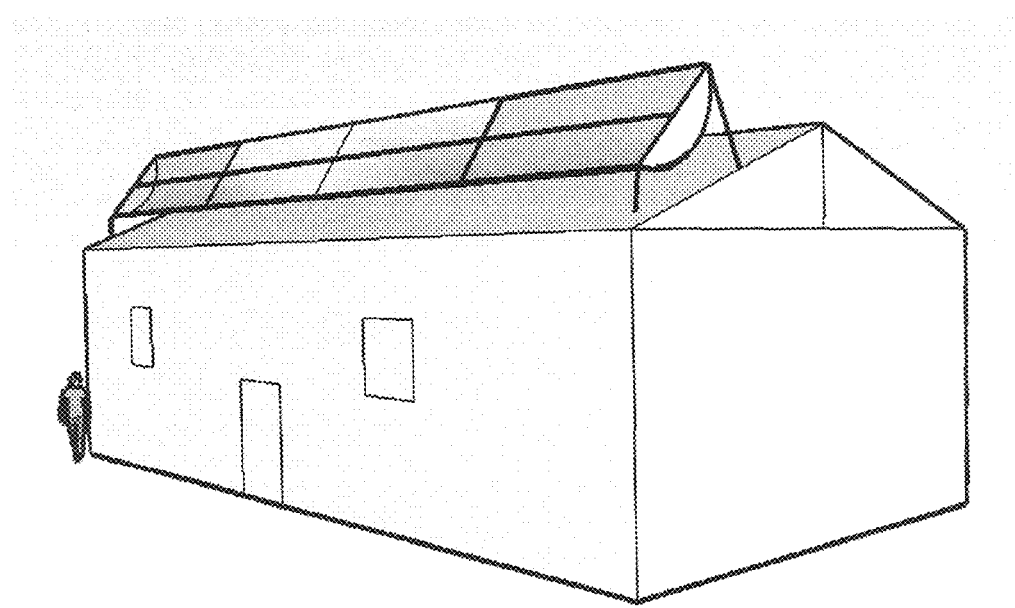
FIG. 10 is a perspective view of a structure according to at least one embodiment of the systems disclosed herein, which includes a parabolic solar collector retrofitted to an existing structure.

FIG. 7 is a perspective view of a structure according to at least one embodiment of the systems disclosed herein, with a parabolic solar canopy as a concentrator 36. This particular use can be readily adapted to retrofit existing commercial structures. This diagram illustrates the position of the electric motors 18 on the structure itself rather than being attached to the self-tracking hook 12 or the support beam 10. This shows an optional positioning of the motor 18 away from the solar hook 12. The concentrator may also be retrofitted on the roof of existing structures by means other than with a canopy. For example, the concentrator may be installed directly on an existing roof, as shown in FIG. 10.

Figure 7A:
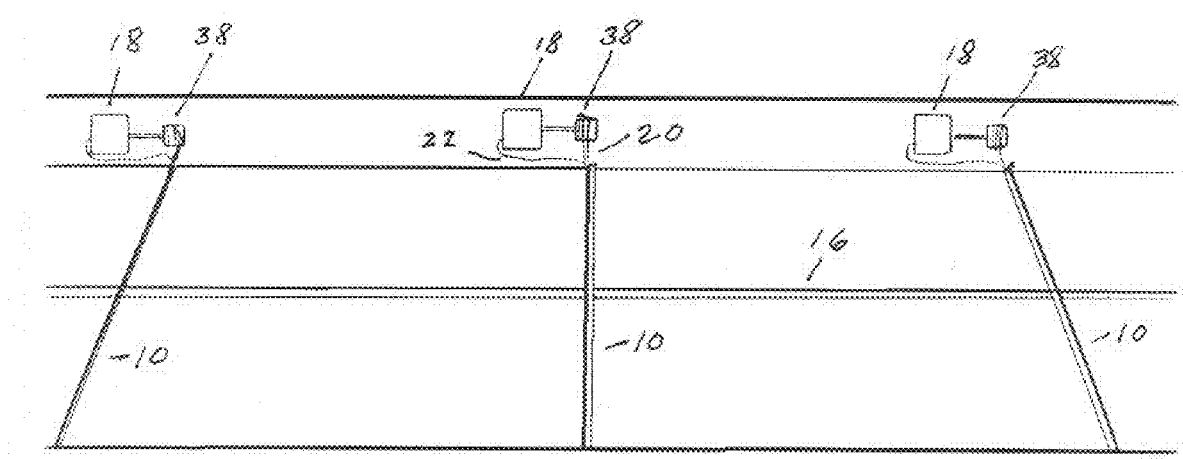
FIG. 7A is a lateral view of the electric motors shown in FIG. 7.

FIG. 7a is a lateral view of the electric motors 18 affixed to the structure of FIG. 7. The motors 18 wind and unwind a wire or cable 20 thereby controlling the movement of a trolley 24 within the support beam 10. The wires or cables 20 can be ganged to operate on a single electric motor 18. For parabolic solar canopies of considerable length this would clearly be desirable as it would also limit the likelihood of the motors 18 moving the receiver 16 disproportionately.

Figure 8:
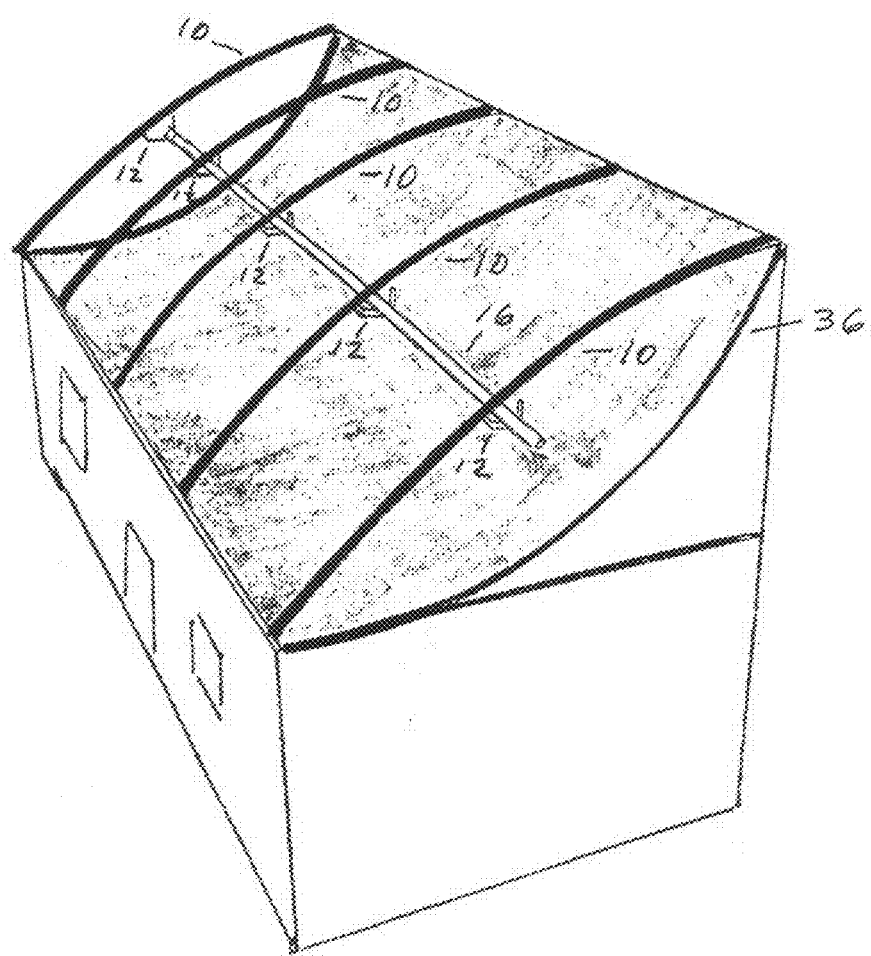
FIG. 8 is a perspective view of a structure according to at least one embodiment of the systems disclosed herein, which includes support beams that are curved to match the path of the points of focus of the parabolic shape of the solar parabolic trough concentrator.

FIG. 8 is a perspective view of a structure according to at least one embodiment of the systems disclosed herein, whose support beams 10 are curved instead of straight to conform to the curved path of the points of focus for a solar parabolic trough concentrator 36 having a curvature other than that prescribed by the formula $Y^2=4AX$. Curved support beams 10 require motion systems that allow for the movement of the self-tracking hook 12 along a curve. One such a system is illustrated in FIG. 2 in which a toothed belt 26 attached to the flange 11 of a support beam 10 that engages the toothed gear 28 of an electric motor 18. The toothed belt may be similar to a flexible automotive belt, which may be adhered to any curved surface. Another such system that would also be effective for use with a curved support beam 10 is the clothes-line motive system shown in FIG. 1B.

FIG. 9 is a lateral view of the solar parabolic trough concentrator 36 according to at least one embodiment of the systems disclosed herein. As can be seen, the rays of the sun 37 enter and get reflected off of the solar parabolic concentrator 36. The reflected rays 39 strike the each leg of the "V" shaped portion of the hook 12 with the photovoltaic cells 14 disposed thereon. The energy produced by the photovoltaic cells 14 causes the hook 12 and the receiver 16 attached thereto to move into, and stay, in the concentrator's path of the points of focus. The tilt of the solar parabolic trough concentrator 36 is preferably always towards the equator. This illustration presents a typical northern hemisphere installation at an approximate latitude of 35° The total sweep of movement of the sun as it travels from east to west will result in a relatively little diurnal and seasonal movement of the self-tracking hook 12 and receiver 16. This fact permits the use of relatively small and inexpensive high torque, low RPM DC electric motors 18 to be used for tracking purposes.

Operation

This application discloses a movable "V" or modified "V" shaped self-tracking hook 12, which supports and moves the receiver 16 for an immobile solar parabolic trough concentrator 36. The self-tracking hook 12 hangs from a support beam 10 which spans the two sides of a solar parabolic trough concentrator 36. The immobile solar parabolic trough concentrator 36 may be a roof, wall, canopy, carport or other immobile structure. The concentrators 36 may also be used as the roof or wall surface of a motor home or trailer. The solar parabolic trough concentrator 36 ideally faces the direction of the equator, and is tilted at an angle close to the latitude of the installation. The receiver 16 is positioned along the length of the solar parabolic trough concentrator 36 in an east to west direction, and moves in a north to south direction while tracking the sun.

The downward facing surfaces of the "V" or modified "V" shaped self-tracking hook 12 have identically powered photovoltaic cells 14 affixed to them. These photovoltaic cells 14, positioned on opposite sides of the center point of the downward facing surfaces of the self-tracking hook 12, are separately wired to the positive and negative poles of a high torque, low RPM reversible DC electric motor 18. When the upwardly directed rays of the sun reflected from the solar parabolic trough concentrator 36 strike the downward facing sides of the photovoltaic cells 14, an electric current is generated that causes the reversible motor 18 to move the self-tracking hook 12 along with the receiver 16 it is holding in the direction of the solar parabolic trough concentrator's path of the points of focus. The receiver 16 is preferably positioned directly behind the center point of the self-tracking hook 16.

The self-tracking hook 16 stops moving when the electric current being generated from the photovoltaic cells 14 on one side of the self-tracking hook 12 reaches parity with the current being generated by the photovoltaic cells 14 on the other side of the center point of the self tracking hook 12. As the sun's position in the sky shifts, the motor 18 responds to the inequality of current being emitted by the opposing photovoltaic cells 14, and brings the center point of the self tracking hook 12 and/or receiver 16 back to the focal point of the concentrator. In this manner, the focal point of the solar parabolic trough concentrator 36 stays precisely or as close as possible on the receiver 16, which is aligned with the center point of the "V" or modified "V" shaped self-tracking hook 12.

Because the concentrated solar power striking the photovoltaic cells 14 on the self-tracking hook 12 will generate about 30 suns of magnification or more, no outside energy source will be needed to move the receiver 16. However, should it be desirable, the electric current from the self-tracking hook 12 may be used to operate a switch therewith allowing the reversible motor 18 to run from an external power source. Further modification of the systems disclosed herein will occur to persons skilled in the art, and all such modifications are deemed to be within the spirit and scope of the present invention.

The support beam 10 may be straight or curved and it may be constructed of a bar, rod, tube or any other structural form capable of providing the rigid support necessary for the accurate movement of the self tracking hook 12. Although the support beam 10 will likely be metallic, other rigid material may be used.

Architectural and engineering considerations will determine the optimum spacing between the support beams 10. The support beam 10 may be hollow, with a profile suitable for the motive means for moving the solar hook 12, or it may be solid, as illustrated in FIG. 4.

The preferred embodiment for the self-tracking receiver is shown in FIG. 2. It integrates an electric motor 18 with the self-tracking hook 12. The electric motor 18 is positioned perpendicular within the support beam and has a tooth gear 28 attached to the drive of the motor 18. The tooth gear 18 engages a flexible toothed belt which is affixed to a flange 11 of the support beam 10. As the gear 18 rotates, it acts against the corresponding teeth on the flange thereby causing the motor 18, self-tracking hook 12, and the receiver 16 to move in the desired direction along at least a portion of the length of the support beam 10. The motor 18 in this application may be a high torque, low RPM DC motor that derives its power from the photovoltaic cells 14 on the self-tracking hook 12 via electric connectors 22 that couple the cells 14 and the motor 18. The cells 14 are attached differentially to the positive and negative poles of the motor 18 as discussed herein.

In this or another embodiment, the solar collector utilizes a fixed solar parabolic trough concentrator 36 whose parabolic curve is defined by the equation $Y^2=4AX$. This specific parabolic shape produces a focal point that always falls in a straight line along the chord of the parabola. Therefore, the support beam 10 holding the solar tracking hook 12 may also be straight so that the receiver 16 can remain in the path of the points of focus.

In other embodiments, the DC motor 18 may be attached to the solar tracking hook 12. The motor 18 turns a threaded rod or bolt through a nut 30; the nut 30 being affixed to the support beam 10. This action is similar to that of a screw drive on an automatic garage door opener. This action of the motor 18 keeps the solar tracking hook 12 and the receiver 16 in the focal point of the parabolic trough concentrator 36.

Although the preferred parabolic reflector curve is defined by the equation $Y^2=4AX$ and the vertex is (0.0), which allows the use of a straight support beam 10 to take advantage of the path of the points of focus that is a straight line that falls along the chord line, larger roof surfaces may call for a shallower parabolic trough concentrator 36 than that defined by the equation $Y^2=4AX$. The path of the focal point for a shallower parabolic trough concentrator 36 is bowed. In such an instance, the shape of the support beam 10 will be curved to as precise as possible or practical to duplicate the arc of movement of the path of the focal point emanating from the shallower parabolic trough concentrator 36. The positioning of the support beam above the concentrator 36 should take into account the distance between the support beam 10 and the receiver 16 to ensure that the receiver 16 intercepts the focal point for the particular parabolic curve selected, not the support beam 10.

In another embodiment, the motive power for the self-tracking hook 12 is provided at one end of the support beam 10. The motor 18 is actuated by an electric current generated by the photovoltaic cells 14 on the solar tracking hook 12. The motor 18, responding to the differentially stronger electric currents, moves the solar tracking hook 12 along the support beam 10 by means of a control wire 22, a wire, cable or chain 20, or any other similar means. The motor may operate on a current that is the difference between the current produced by each of the photovoltaic cells 14. Alternatively, the motor 14 may include a controller that determines that a different current is being created by one of the photovoltaic cells 14 and combines the current to drive the motor. When the current is the same, the controller may store the energy in a rechargeable battery or capacitor. In this instance, the battery and/or the capacitor may provide supplemental current to drive the motor 14. The reversible motor 18 may also control the movement of any number of solar hooks 12 by means of wires, cables or chains, emanating from the support beams. In this case, the electrical output from a series of solar tracking hooks 10 can be combined to power the motor 18.

Additionally the differential current from the photovoltaic cells 14 can actuate a switch that controls the movement of the reversible motor 18 powered by an external source of electricity. This embodiment may be suitable in instances where the length of the trough concentrator 26 is quite long, such as when it is disposed in the canopy in a shopping center mall and the use of several motors may be desirable.

In most cases, a counterweight can be attached to the wire or cable to reduce the load on the motor or motors. The counterweight can be inserted into the loop of the clothes-line type of motive system illustrated in FIG. 1B. This will operate like the counterweight of an elevator to neutralize the weight of the receiver. A counterweight can also be readily incorporated in the motive system attached to the structure, as illustrated in FIG. 7A.

The wide opening on the solar tracking hook 12 offers ease of insertion and removal of the receiver 16. The receiver 16 is positioned in the notch of the "V" or other similarly shaped portion of the receiver support, such as a "C", "D", "Y", etc.-shaped solar tracking hook 12, and stays in place by gravity or with a mechanical connection. Maintenance, cleaning, or replacement of the energy absorption tube 16 is simplified by the ability to simply lift the receiver 16 out of the solar tracking hook 12 without the need to remove the solar tracking hook 12 or the support beam 10. This also permits the tracking system to be tested for accuracy even before the energy absorption tube is inserted in place.

The reflective material of choice for roof structures is mirrorized stainless steel of 24 to 26 gauge thickness. This thickness is similar to the gauge in metal roofs typically used in "Butler" and other metal buildings except that using stainless steel significantly extends the life of the roof beyond that of conventional roofing surfaces. The payback period for solar projects is typically calculated on the basis of the cost of the solar installation itself; however, because a new or existing structure built with a parabolic trough concentrator with stainless steel offers much longer life than a standard roof, the lower cost for roof repair or replacement over time can dramatically alter the economics of a project and accelerate acceptance of this technology into the marketplace. Mirrorized glass, aluminum, or plastic are acceptable alternative materials particularly when used for walls, canopies or other non-roof applications.

The solar systems disclosed herein may also be used in mobile applications, such as recreational vehicles, mobile homes, and other transitory installations. When referring to the concentrator as immobile, this means that the concentrator itself remains fixed to the structure to which it is attached during its period of operation. It is understood that the entire concentrator and structure may be moved and assembled at will. Although the systems disclosed herein are ideally suited to new construction or for canopy additions to existing structures, experience may determine that its simplicity and low cost could find practical application for free-standing immobile solar parabolic trough concentrators.

While the foregoing invention has been described in some detail for purposes of clarity and understanding, it will be appreciated by one skilled in the art, from a reading of the disclosure, that various changes in form and detail can be made without departing from the true scope of the invention in the appended claims.

What is claimed is:

1. A solar collector comprising:
   a parabolic solar concentrator having a parabolic cross section with a first end, a second end, a midpoint between the first end and the second end, and a path of points of focus;
   a support beam having a length that spans across the first and the second ends of the concentrator; and
   a receiver support member movably attached to the support beam above the concentrator, the receiver support member comprising:
      a receiver at least loosely attached to the receiver support member,
      a plurality of photovoltaic cells, at least one of the cells facing a first direction and at least one other of the cells facing a second direction toward the concentrator different than the first direction,
      a motor that is operatively coupled to the receiver support member for the motor to move the support member along at least a portion of the length of the support beam, wherein the photovoltaic cells are electrically coupled to the motor to provide a signal to control the motor and to provide at least a portion of the power to drive the motor, and the receiver support member comprising a hook shaped portion having a first leg and a second leg that meet at a vertex facing toward the concentrator, wherein at least one of the photovoltaic cells is disposed on the first leg, at least another one of the photovoltaic cells is disposed on the second leg, and the receiver is disposed in a notch of the hook shaped portion.

2. The system of claim 1, wherein the hook shaped portion of the support member and the receiver share a common center point and wherein the motor moves the hook shaped portion along the path of the points of focus of the concentrator.

3. The system of claim 1, wherein the hook shaped portion comprises an upright portion that has an end that extends from one of the legs and an opposite end that movably couples the hook shaped portion to the support beam.

4. The system of claim 3, wherein the hook shaped portion comprises a trolley disposed on the opposite end of the upright portion and within the support beam through a lengthwise opening in the support beam that allows the trolley to move along at least a portion of the length of the support beam.

5. The system of claim 4, wherein the trolley is coupled to the motor with at least one of a guide wire or cable, the motor therewith operable to pull the trolley in at least one direction along the length of the support beam.

6. The system of claim 5, wherein the trolley comprises a plurality of wheels that ride on at least one flange associated with the support beam 10.

7. The system of claim 5, comprising a plurality of pulleys at opposite ends of the hook portion in line with the support beam and a continuous wire or cable loop attached to the opposite ends of the trolley, wherein the motor drives one of the plurality of pulleys.

8. The system of claim 3, wherein the motor is integrated into the hook shaped portion at the opposite end of the upright portion, the motor comprising at least one toothed gear that acts against corresponding teeth disposed on a flange associated with the support beam.

9. The system of claim 8, wherein the support beam is a tubular member and wherein the motor is at least partially disposed within the tubular member through a lengthwise opening in the support beam.

10. The system of claim 8, wherein the flange comprises a toothed belt bonded to the flange.

11. The system of claim 3, wherein the motor is integrated into the hook shaped portion at the opposite end of the upright portion, the motor comprising a threaded rod that acts against a corresponding nut fixed to the support beam.

12. The system of claim 11, wherein hook portion is movably attached to the support beam with a collar and wherein the motor and nut are disposed exterior to the support beam.

13. The system of claim 2, wherein the photovoltaic cells are disposed symmetrically about at least one axis that passes through the center point.

14. The system of claim 1, wherein the concentrator is incorporated into one of a roof and a canopy of a structure.

15. The system of claim 1, wherein the concentrator has a curvature having a path of the points of focus that is curved and wherein the support beam has a curvature that matches the curve of the path of the points of focus.

16. A solar collector comprising:
   a parabolic trough solar concentrator having a parabolic cross section with a first end, a second end, a midpoint between the first end and the second end, and a path of points of focus;
   a support beam having a length that spans across the first and the second ends of the concentrator and that has a shape that matches the path of the points of focus of the concentrator; and
   a receiver support member movably attached to the support beam above the concentrator, the receiver support member comprising:
      a hook shaped portion having a first leg and a second leg that meet at a vertex facing toward the concentrator,
      a receiver at least loosely attached to the receiver support member in a notch of the hook shaped portion, and
      a plurality of photovoltaic cells, at least one of the cells disposed on the first leg facing a first direction and at least one other of the cells disposed on the second leg facing a second direction toward the concentrator different than the first direction, a motor that is operatively coupled to the receiver support member for the motor to move the support member along at least a portion of the length of the support beam along a path of the points of focus of the concentrator, wherein the photovoltaic cells are electrically coupled to the motor to provide a signal to control the motor and to provide at least a portion of the power to drive the motor.

17. A solar tracking system comprising:

an immobile solar parabolic trough concentrator, the concentrator directing all of the sunlight reflected off of its surface to a single path of points of focus;

a support beam or beams, having a curvature, that spans the solar parabolic concentrator, the curvature of the support beam duplicating the path of the points of focus of the solar parabolic trough concentrator;

a "V" or modified "V" shaped self-tracking receiver support member suspended from the support beam, the self-tracking support member having two or more surfaces facing downward into the solar parabolic trough concentrator;

two or more equally powered, photovoltaic cells oppositionally attached to the downward facing surfaces of the self-tracking support member, the downward facing photovoltaic cells intercepting the solar lines reflected off the solar parabolic trough concentrator; and a receiver placed into the "V" or modified "V" section of the self-tracking support member, the receiver being in alignment with the center point between the opposing photovoltaic cells;

wherein the motor, responding to the differential current from the opposing photovoltaic cells, moves the self-tracking support member and the receiver as a unit into the path of the points of focus of the solar parabolic trough concentrator and the motor, responding to the differential current from the opposing photovoltaic cells, moves the self-tracking support member and the receiver into the focal point of the solar parabolic trough concentrator.

* * * * *